(12) United States Patent
Ting et al.

(10) Patent No.: US 9,653,148 B1
(45) Date of Patent: May 16, 2017

(54) MULTI-BANK MEMORY DEVICE AND SYSTEM

(71) Applicant: Piecemakers Technology, Inc., Hsinchu (TW)

(72) Inventors: Tah-Kang Joseph Ting, Taipei (TW); Gyh-Bin Wang, Hsinchu County (TW); Ming-Hung Wang, Hsinchu (TW)

(73) Assignee: Piecemakers Technology, Inc., Hsinchu (TW)

( * ) Notice: Subject to any disclaimer, the term of this patent is extended or adjusted under 35 U.S.C. 154(b) by 0 days.

(21) Appl. No.: 15/047,605

(22) Filed: Feb. 18, 2016

(51) Int. Cl.
| G11C 5/06 | (2006.01) |
| G11C 11/4093 | (2006.01) |
| G11C 11/4076 | (2006.01) |
| G11C 11/4094 | (2006.01) |
| G11C 11/4096 | (2006.01) |

(52) U.S. Cl.
CPC ...... *G11C 11/4093* (2013.01); *G11C 11/4076* (2013.01); *G11C 11/4094* (2013.01); *G11C 11/4096* (2013.01)

(58) Field of Classification Search
None
See application file for complete search history.

(56) References Cited

U.S. PATENT DOCUMENTS

| 2002/0126531 A1* | 9/2002 | Hosono | G11C 11/5621 365/185.17 |
| 2006/0136680 A1* | 6/2006 | Borkenhagen | G06F 9/5061 711/154 |
| 2008/0205187 A1* | 8/2008 | Pyeon | G06F 13/4291 365/230.08 |
| 2015/0221358 A1* | 8/2015 | Brandl | G11C 11/4087 365/222 |

* cited by examiner

*Primary Examiner* — Son Dinh
*Assistant Examiner* — Uyen B Tran
(74) *Attorney, Agent, or Firm* — Winston Hsu; Scott Margo

(57) ABSTRACT

A memory device includes a common data bus, a plurality of memory banks and a control circuit. The memory banks are coupled to the common data bus. The memory banks share the common data bus. Each of the memory banks includes a storage device and a data register. The data register is coupled between the storage device the common data bus, and is arranged for storing data read from the storage device. The control circuit is coupled to storage devices and data registers of the memory banks, and is arranged for referring to an address signal and an access signal to control the storage device of said each memory bank to output the data to the corresponding data register, and referring to the address signal and a programmable latency time to control the data registers to output data from the memory banks to the common data bus.

9 Claims, 4 Drawing Sheets

MULTI-BANK MEMORY DEVICE AND SYSTEM

BACKGROUND OF THE INVENTION

1. Field of the Invention

The disclosed embodiments of the present invention relate to memory, and more particularly, to a multi-bank memory device capable of referring to a programmable latency time to continuously output data from multiple memory banks to a common data bus.

2. Description of the Prior Art

A conventional memory utilizes data registers (FIFO) for temporary storage of data due to access latency. Please refer to FIG. 1, which is a block diagram illustrating a conventional dynamic random access memory (DRAM) 100. A shown in FIG. 1, a control circuit 104 controls each of a plurality of decoders (DEC) 110_1-110_3 to decode an address signal ADD according to an access signal ACS (a clock signal), and data read from a plurality of memory cell arrays 106_1-106_3 are transmitted to a plurality of sense amplifiers 120_1-120_3 through a plurality of data paths SA1-SA3, respectively. Next, the sense amplifiers 120_1-120_3 immediately transmit the data read from the memory cell arrays 106_1-106_3 to data register(s) 130 (e.g. a first-in first-out register (FIFO)) through a common data bus 160 (which is shared by a plurality of memory banks 102_1-102_3), and an off-chip driver (OCD) 140 of an output circuit 132 receives an output of the data register(s) (FIFO) 130 to generate a data output DQ, wherein data output timing of the data register(s) (FIFO) 130 is controlled by the control circuit 104. Additionally, in a write mode, an input buffer 150 of the output circuit 132 receives data to be written, and transmits the data to be written to the data register(s) (FIFO) 130 through the common data bus 160.

FIG. 2 illustrates a timing diagram of the DRAM 100 shown in FIG. 1 which operates in a burst mode to access the same memory bank continuously. For illustrative purposes, a plurality of rising edges of the access signal ACS are labeled $R_0$-$R_{15}$ in FIG. 2. At the rising edge $R_0$, the memory bank 102_1 enables data access according to an output of the DEC 110_1. After a period of time (an address access time (tAA)), data D0-D3 are read from the memory cell array 106_1 to the data path SA1 (at a time point between the rising edge $R_4$ and the rising edge $R_5$), and the sense amplifier 120_1 transmits the data D0-D3 to the data register(s) (FIFO) 130 through the common data bus 160. As the DRAM 100 has a read latency of 9 clock cycles, the data D0-D3 are outputted from the OCD 140 at the rising edges $R_9$-$R_{12}$ respectively. Similarly, data D4-D5 read from the memory cell array 106_2 are outputted from the OCD 140 at the rising edges $R_{13}$-$R_{14}$ respectively, and data D6-D7 read from the memory cell array 106_3 are outputted from the OCD 140 at the rising edges $R_{15}$-$R_{15}$ respectively.

As can be seen from FIG. 1 and FIG. 2, a first-in first-out register is used to buffer continuous burst data before a long column address strobe (CAS) latency is satisfied. However, this causes an increase in circuit area and manufacturing costs. Similar problems are also encountered when data are read out from different memory banks of the DRAM 100 in sequence.

SUMMARY OF THE INVENTION

It is therefore one objective of the present invention to provide a multi-bank memory device, which is capable of referring to a programmable latency time to continuously output data from multiple memory banks to a common data bus, to solve the above problems.

According to an embodiment of the present invention, an exemplary memory device is disclosed. The exemplary memory device comprises a common data bus, a plurality of memory banks and a control circuit. The memory banks are coupled to the common data bus. The memory banks share the common data bus. Each of the memory banks comprises a storage device and a data register. The data register is coupled between the storage device the common data bus, and is arranged for storing data read from the storage device. The control circuit is coupled to storage devices and data registers of the memory banks, and is arranged for referring to an address signal and an access signal to control the storage device of said each memory bank to output the data to the corresponding data register, and referring to the address signal and a programmable latency time of more than 10 clock cycles to control the data registers of the memory banks to output data from the memory banks to the common data bus.

As the proposed memory device may refer to a programmable latency time to output data from a selected one of a plurality of memory banks to a common data bus shared by the memory banks of a multi-bank memory device, there can be no need to dispose data register(s) (FIFO) between the common data bus and an external data bus externally connected to the proposed memory device. Additionally, the proposed memory device may perform continuous data access (e.g. burst access) by enabling respective data access operations of a plurality of memory banks alternately without the use of data register(s) (FIFO). Hence, not only is circuit area saved, but also manufacturing costs are reduced.

These and other objectives of the present invention will no doubt become obvious to those of ordinary skill in the art after reading the following detailed description of the preferred embodiment that is illustrated in the various figures and drawings.

DETAILED DESCRIPTION

The proposed multi-bank memory device may latch a data element read from a memory cell before the data element is outputted to a common data bus shared by all memory banks, and determine when to output the latched data element to the common data bus, thus reducing circuit area and enhancing operating performance. For example, by alternately enabling a plurality of memory banks to perform data access (e.g. data access in a burst mode), the proposed memory device may realize seamless continuous data access without the use of data register(s) (FIFO). The proposed memory architecture may be employed in a synchronous memory device or an asynchronous memory device. Further description is provided below.

Figure 3:
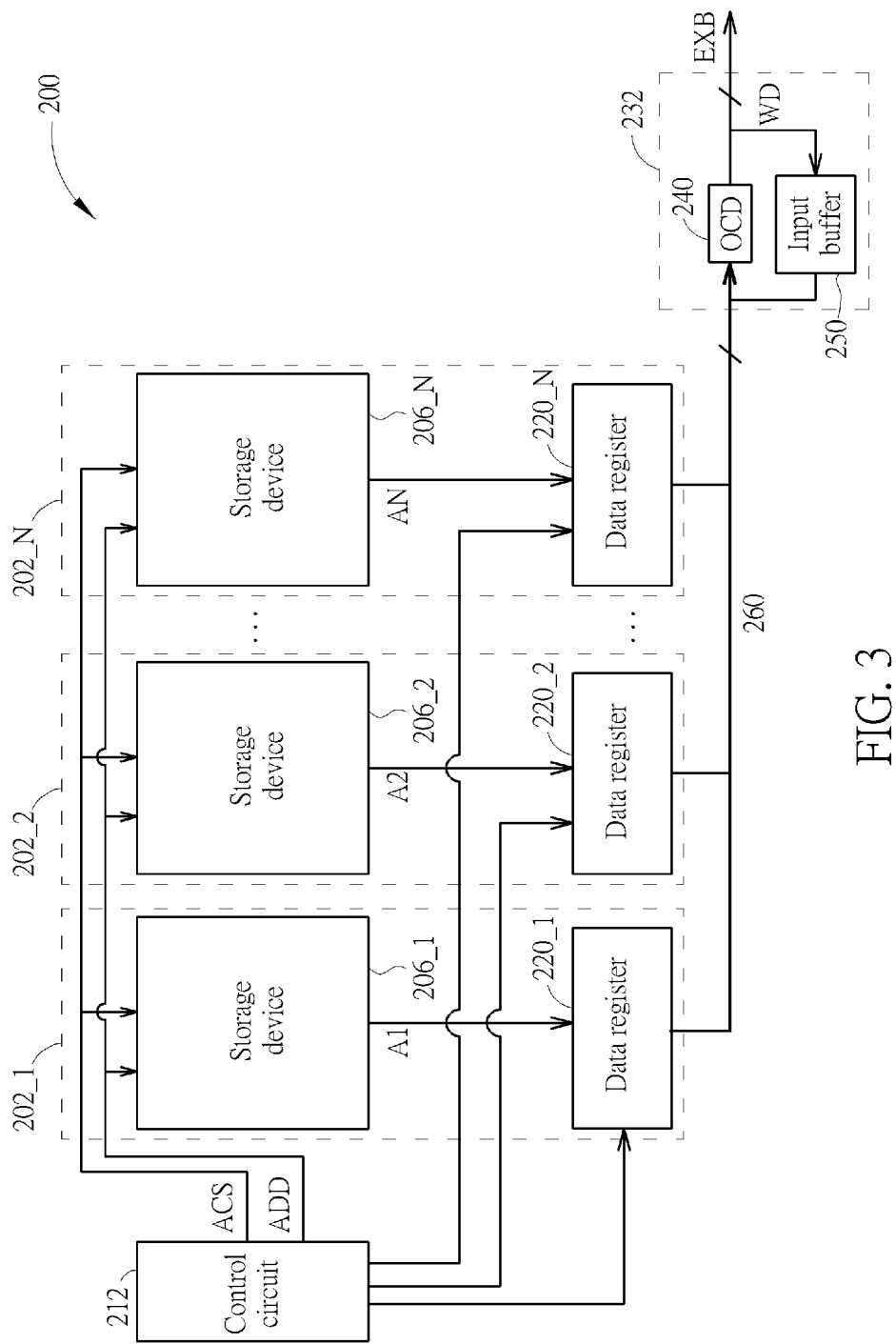
FIG. 3 is a block diagram illustrating an exemplary memory device according to an embodiment of the present invention.

Please refer to FIG. 3, which is a block diagram illustrating an exemplary memory device according to an embodiment of the present invention. The memory device 200 may include, but is not limited to, a common data bus 260, a plurality of memory banks 202_1-202_N, a control circuit 212 and an output circuit 232, wherein N is a positive integer. The memory banks 202_1-202_N are coupled to the common data bus 260, wherein the common data bus 260 is shared by the memory banks 202_1-202_N. The control circuit 212 is coupled to the memory banks 202_1-202_N and the output circuit 232, and may be arranged for generating an access signal ACS and an address signal ADD to control data access operations of the memory banks 202_1-202_N, and referring to the address signal ADD and a programmable latency time to control the memory banks 202_1-202_N to output data to the output circuit 232 through the common data bus 260. The output circuit 232 is coupled between the common data bus 260 and an external data bus EXB externally connected to the memory device 200, and is arranged for generate a data output DQ according to the data received from the common data bus 260.

In this embodiment, each of the memory banks 202_1-202_N may include a storage device (one of storage devices 206_1-206_N) and a data register (one of data registers 220_1-220_N), wherein the data register is coupled between the storage device and the common data bus 260, and is arranged for storing data read from the storage device. The control circuit 212 may refer to the address signal ADD and the access signal ACS to control the storage device (one of the storage devices 206_1-206_N) to output the data to the data register (a corresponding one of the data registers 220_1-220_N) through a data path (a corresponding one of data paths A1-AN), and referring to the address signal ADD and the programmable latency time to control the data register to output the data stored in the data register to the common data bus 260. Specifically, the control circuit 212 may refer to the address signal ADD to determine which of the data registers 220_1-220_N should output the data stored therein, and the control circuit 212 may refer to the programmable latency time to determine data output timing of a selected data register.

Byway of example but not limitation, in a case where the memory device 200 operates in a synchronous mode (e.g. the memory device 200 is implemented by a synchronous memory device), the programmable latency time may be duration of a predetermined number of clock cycles of the access signal ACS (e.g. a clock signal). In another case where the memory device 200 operates in an asynchronous mode (e.g. the memory device 200 is implemented by an asynchronous memory device), and the programmable latency time may be a predetermined delay time of the access signal ACS.

In one implementation, the programmable latency time may be programmed/set to be more than 10 clock cycles. For example, each clock cycle may equal a minimum clock cycle time utilized in the memory device 200. In another example, the programmable latency time may be programmed/set by the control circuit 212. Additionally, in some embodiments, the control circuit 212 may refer to the address signal ADD and the programmable latency time of more than 10 clock cycles to control the data registers 220_1-220_N to continuously output data from the memory banks 202_1-202_N to the common data bus 260. Related description will be given later.

In another implementation, at least one of the data registers 220_1-220_N may be implemented by a single-stage data buffer. In yet another implementation, at least one of the data registers 220_1-220_N may be implemented by a multi-stage data buffer. As long as a data register within a memory bank may refer to a programmable latency time to output data to a common data bus shared by all memory banks of a multi-bank memory device, various modifications and alternatives may be made without departing from the spirit and scope of the present invention.

As the memory device 200 may latch a data element read from a storage device (e.g. a memory cell array) in a corresponding data register before the data element is outputted to the common data bus 260, and program when the corresponding data register should output the latched data element to the common data bus 260, the memory device 200 need not a buffer register which is disposed on the common data bus 260 for buffering data, thus reducing circuit area and manufacturing costs.

Further, the control circuit 212 may enable the memory banks 202_1-202_N alternately so that respective data stored in the memory banks 202_1-202_N may be outputted alternately from the output circuit 232. By way of example but not limitation, the control circuit 212 may enable the memory banks 202_1-202_N alternately so that each storage device outputs one data element at a time, and control the data registers 220_1-220_N to refer to an activation sequence of the memory banks 202_1-202_N to output respective data elements read from the storage devices 206_1-206_N one at a time.

Figure 1:
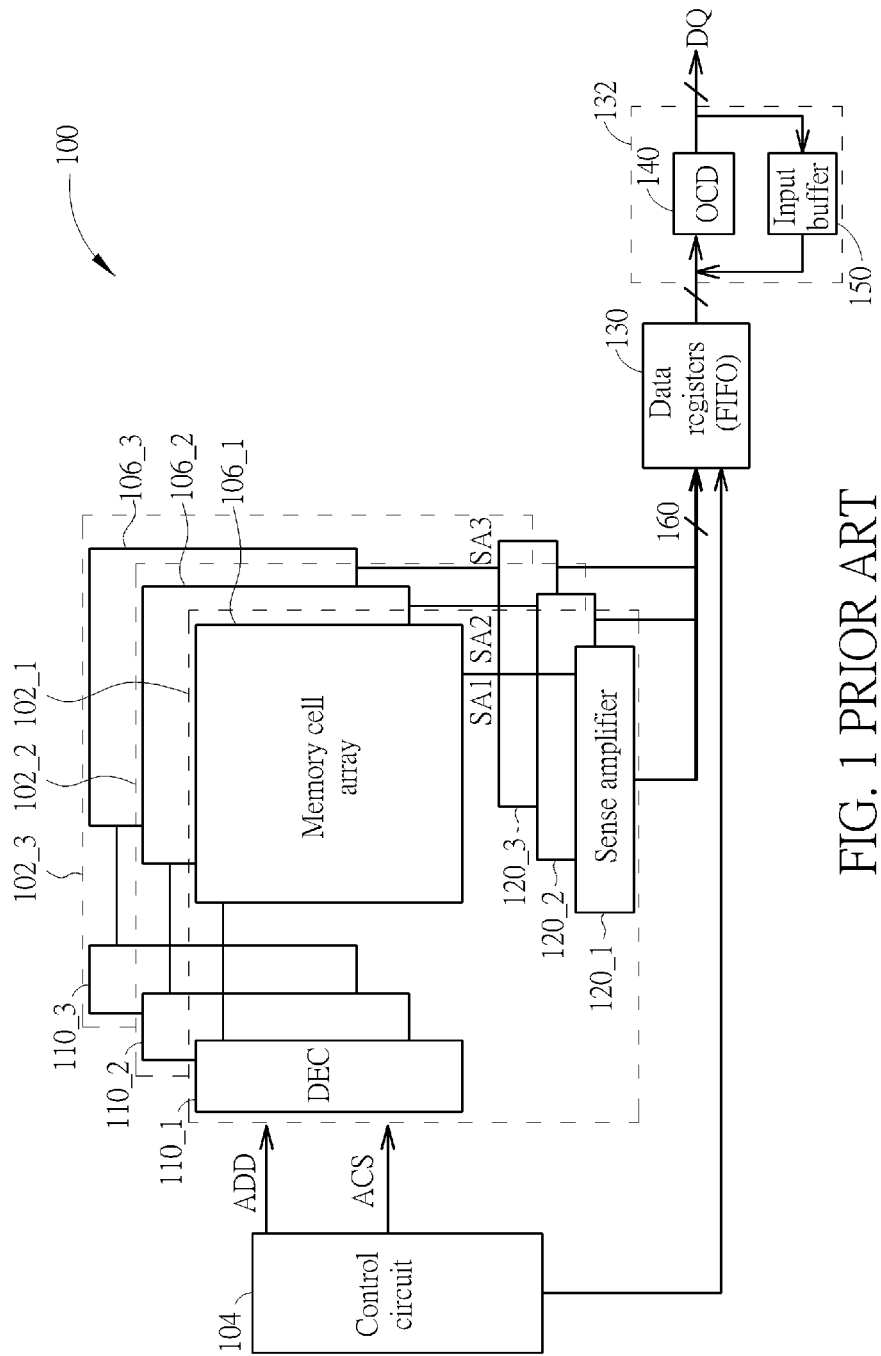
FIG. 1 is a block diagram illustrating a conventional dynamic random access memory.
Figure 2:
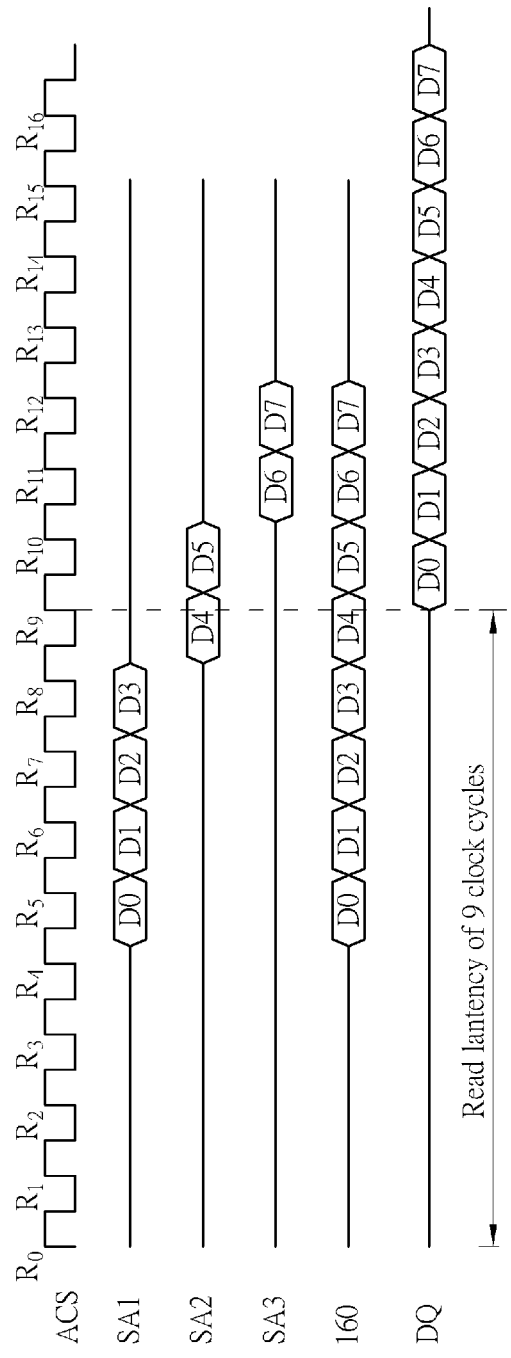
FIG. 2 illustrates a timing diagram of the dynamic random access memory shown in FIG. 1 which operates in a burst mode to access the same memory bank continuously.

In the embodiment shown in FIG. 2, the output circuit 232 may include, but is not limited to, a drive circuit (implemented by an off-chip driver (OCD) 240 in this embodiment) and an input buffer 250. The OCD 240 may be directly coupled to the common data bus 260, and is arranged for driving the data received from the common data bus 260 onto an external data bus EXB. Additionally, when the memory device 200 operates in a write mode, the input buffer 250 may receive data WD (e.g. data to be written) and transmit the data WD to at least one of the memory banks 202_1-202_N through the common data bus 260. In other words, the common data bus 260 may be used as a bidirectional data bus in this embodiment.

Please note that the common data bus 260 may be indirectly coupled to the OCD 240 (e.g. the driver circuit). By way of example but not limitation, the memory device 200 may further include at least one buffer stage (not shown in FIG. 3), wherein the at least one buffer stage is coupled between the common data bus 260 and the OCD 240 (or the output circuit 232), and is arranged for buffering the data received from the common data bus 260 and outputting the buffered data to the OCD 240. Next, the OCD 240 may drive the buffered data outputted from the at least one buffer stage onto the external data bus EXB.

In a case where the memory device 200 operates in a continuous read mode (e.g. a burst access mode, in which a memory device transfers a plurality of data elements continuously without interruption), after enabling a memory bank to perform a read operation (e.g. accessing one data element), the control circuit 212 may not enable the memory bank to perform another read operation until the programmable latency time (e.g. a read latency time) has elapsed, thereby ensuring each data element read from a storage device of the memory bank may be outputted from the memory bank. The programmable latency time may be controlled by the control circuit 212, and may be a period of time during which data (e.g. a data element) to be read is read from the storage device and outputted to the common data bus 260. In other words, the control circuit 212 may control the memory banks 202_1-202_N to perform read operations alternately according to the address signal ADD and the access signal ACS, and control a time interval between two consecutive read operations performed by one of the memory banks to be longer than a corresponding read latency time of the memory bank (i.e. the one of the memory banks).

It should be noted that, in a case where the number of the memory banks 202_1-202_N is sufficiently large, the output circuit 232 may output the data elements read from the memory banks 202_1-202_N alternately and continuously without temporarily storing the data elements in data register (s) (e.g. FIFO (s)) in advance. In other words, there may be no need to dispose data register(s) (FIFO(s)) between the common data bus 260 and the external data bus EXB, thus decreasing circuit area and manufacturing costs. By way of example but not limitation, in a case where the memory device 200 is implemented by a synchronous memory device, the access signal ACS may be implemented by a clock signal, and the number of the memory banks 202_1-202_N may be greater than the programmable latency time (a read latency time) divided by a clock cycle time of the clock signal. In another case where the memory device 200 is implemented by an asynchronous memory device, the access signal ACS may indicate a plurality of address read commands, and the number of the memory banks 202_1-202_N may be greater than the programmable latency time (a read latency time) divided by a time interval between two consecutive address read commands of the read commands. Accordingly, the control circuit 212 may not enable data access of a storage device of a memory bank until a corresponding data register outputs a data element read from the storage device in response to previous data access. The output circuit 232 may have no FIFO(s) disposed therein.

Since two consecutive clock cycles may be regarded as two consecutive address read commands in a synchronous operating mode of a memory device, the determination of the number of the memory banks 202_1-202_N in a synchronous/asynchronous memory device may be summarized as follows: when the access signal ACS indicates a plurality of address read commands, the number of the memory banks 202_1-202_N may be greater than the programmable latency time divided by a time interval between two consecutive address read commands.

Figure 4:
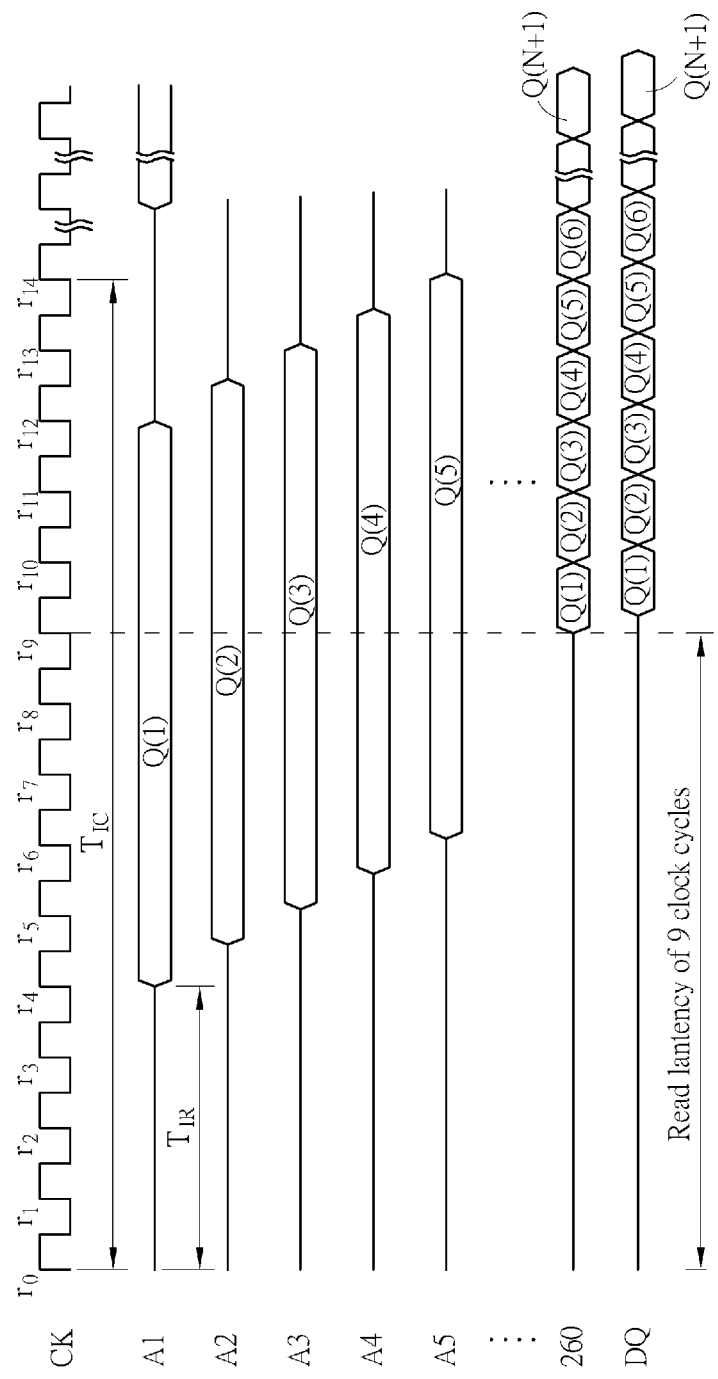
FIG. 4 illustrates a timing diagram of the memory device shown in FIG. 3 which operates in a continuous read mode according to an embodiment of the present invention.

For a better understanding of the present invention, FIG. 4 illustrates a timing diagram of the memory device 200 shown in FIG. 3 which operates in a continuous read mode according to an embodiment of the present invention. Please refer to FIG. 4 in conjunction with FIG. 3. For illustrative purposes, the access signal ACS shown in FIG. 3 may be implemented by a clock signal CK shown in FIG. 4 in this embodiment, wherein the control circuit 212 may set a read latency of each memory bank to 9 clock cycles (i.e. nine times a clock cycle of the clock signal CK), and the number of the memory banks 202_1-202_N may be 14 (N is 14). However, this is not meant to be a limitation of the present invention. Additionally, a plurality of rising edges of the clock signal CK are labeled $r_0$-$r_{14}$ in FIG. 4 respectively to facilitate description of the proposed memory control mechanism.

Firstly, at the rising edge r0, the control circuit 212 may enable the storage device 206_1 of the memory bank 202_1 to transmit a data element Q(1) to the data register 220_1. After an internal memory read time TIR has elapsed, the data element Q(1) stored in the storage device 206_1 may be read out thereof (i.e. the rising r4). As the control circuit 212 may control the memory banks 202_1-202_N alternately to perform read operations, respective data elements stored in the memory banks 202_2-202_N (e.g. data elements Q(2)-Q(N)) may be outputted to the data paths A2-AN at the rising edges r5-rN+3 (not shown in FIG. 4), respectively.

In this embodiment, a read latency time of each memory bank may be set to the read latency multiplied by a clock cycle time of the clock signal CK. Hence, the data element Q(1) may be outputted to the common data bus 260 at the rising edge $r_9$, the data element Q(2) may be outputted to the common data bus 260 at the rising edge $r_{10}$, and so on. Next, the output circuit 232 (or the OCD 240) may output the data elements Q(1)-Q(N) in sequence as the data output DQ. Please note that, before the data of the memory banks 202_1-202_N are outputted to the common data bus 260, the control circuit 212 may control the data registers 220_1-220_N to latch (or temporarily store) respective received data a programmable period of time (e.g. a read latency time) first and then output the respective latched data. Additionally, in order to avoid that a read operation is performed on a storage device (e.g. one of the storage devices 206_1-206_N) to read a next data element when a current data element to be read has not been read out of the storage device, the control circuit 212 may set the read latency time to be longer than a period of time during which data stored in the storage device is read out of the storage device (e.g. the internal memory read time $T_{IR}$).

After the memory bank 202_N is enabled to perform data access, the control circuit 212 may enable the memory bank 202_1 again to perform another read operation (e.g. at the rising edge $r_{14}$). As a time interval $T_{IC}$ between two consecutive read operations performed by the memory bank 202_1 is longer than a read latency time thereof (e.g. nine times the clock cycle time of the clock signal CK), each data element outputted from the storage device 206_1 (e.g. the data elements Q(1) and Q(N+1)) may be successfully outputted from the output circuit 232.

Although a product of the read latency and the clock cycle time of the clock signal CK is used as a read latency time of each memory bank in the above embodiments, this is not meant to be a limitation of the present invention. For example, the read latency multiplied by the clock cycle time of the clock signal CK may be longer than the read latency time so as to ensure data integrity. Additionally, the control circuit 212 may set different read latency times (or different read latencies) in response to different clock cycle times. In order to ensure that the number of the memory banks 202_1-202_N is large enough to realize seamless data access, the number of the memory banks 202_1-202_N may be set to a value greater than a read latency time divided by a minimum clock cycle time of the clock signal CK (i.e. a minimum time interval between two consecutive address read commands). It should be noted that, in a case where the control circuit 212 uses a product of the read latency and the clock cycle time of the clock signal CK as a read latency time of each memory bank, the number of the memory banks 202_1-202_N may be set to a positive integer greater than the read latency set by the control circuit 212.

Further, the architecture of the output circuit 232 shown in FIG. 3 is for illustrative purposes only, and is not meant to be a limitation of the present invention. It is possible to employ other types of circuits (no data register (FIFO) is included therein) capable of outputting data elements read from the memory banks 202_1-202_N in sequence.

In one implementation, each of the storage devices 206_1-206_N may include a memory cell array, wherein a time interval between two consecutive read operations (e.g. the time interval $T_{IC}$) performed by one of the memory banks may be longer than a row cycle time of the one of the memory banks so as to ensure integrity of data read from the one of the memory banks. By way of example but not limitation, the memory device 200 may be implemented by a DRAM, wherein each of the memory banks 202_1-202_N may perform data access only once within a single row cycle time (tRC). Additionally, the number of the memory banks 202_1-202_N may be greater than the row cycle time divided by the clock cycle time of the clock signal CK, wherein the clock cycle time may be a minimum cycle time of the clock signal CK (i.e. a minimum time interval between two consecutive address read commands). Hence, the output circuit 232 may continuously and alternately output data elements read from the memory banks 202_1-202_N without the need to temporarily store the data elements in a data register (FIFO) in advance. Furthermore, the control circuit 212 may set the read latency time to be shorter the row cycle time. In other words, the read latency time set by the control circuit 212 may be between the internal memory read time $T_{IR}$ and the row cycle time of each memory bank.

In addition to alternately reading data elements of the memory banks 202_1-202_N, the control circuit 212 may enable the memory banks 202_1-202_N alternately to perform write operations. Specifically, the control circuit 212 may write data elements to be written into the memory banks 202_1-202_N for further processing (e.g. read operations).

It should be noted that, although the proposed memory control mechanism is described using the clock signal CK shown in FIG. 4, this is not meant to be a limitation of the present invention. In an alternative design, the memory device 200 shown in FIG. 3 may be implemented by an asynchronous memory device, wherein the access signal ACS shown in FIG. 3 may indicate a plurality of address read commands (e.g. the access signal ACS may be implemented by a command signal). To ensure that the number of the memory banks 202_1-202_N is large enough to realize seamless data access, the number of the memory banks 202_1-202_N may be set to a value greater than a programmable latency time (a read latency time) divided by a minimum time interval between two consecutive address read commands of the address read commands (i.e. a minimum interval between two valid address read commands). In another alternative design, when the memory device 200 shown in FIG. 3 is implemented by an asynchronous memory device and each of the storage devices 206_1-206_N of the asynchronous memory device includes a memory cell array, the access signal ACS shown in FIG. 3 may indicate a plurality of address read commands (similar to a plurality of clock cycles shown in FIG. 4), the number of the memory banks 202_1-202_N may be greater than a row cycle time of one of the memory banks divided by a minimum time interval between two consecutive address read commands of the address read commands so as to ensure integrity of data read therefrom. As a person skilled in the art should understand the operation of an asynchronous memory device employing the proposed memory control mechanism after reading the paragraphs directed to FIG. 3 and FIG. 4, similar description is not repeated.

To sum up, as the proposed memory device may refer to a programmable latency time to output data from a selected one of a plurality of memory banks to a common data bus shared by the memory banks of a multi-bank memory device, there can be no need to dispose data register (s) (FIFO (s)) between the common data bus and an external data bus externally connected to the proposed memory device. Additionally, the proposed memory device may perform continuous data access (e.g. burst access) by alternately enabling respective data access operations of a plurality of memory banks without the use of buffer register(s) (e.g. first-in first-out register (s)). Hence, not only is circuit area saved, but also manufacturing costs are reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A memory device, comprising:
   a common data bus;
   a plurality of memory banks, coupled to the common data bus, wherein the memory banks share the common data bus, and each of the memory banks comprises:
      a storage device; and
      a data register, coupled between the storage device and the common data bus, the data register arranged for storing data read from the storage device; and
   a control circuit, coupled to storage devices and data registers of the memory banks, the control circuit arranged for referring to an address signal and an access signal to control the storage device of said each memory bank to output the data to the corresponding data register, and referring to the address signal and a programmable latency time of more than 10 clock cycles to determine a programmable period of time elapsed between when the corresponding data register receives the data transmitted from the storage device and when the corresponding data register outputs the data to the common data bus, in order to control the data registers of the memory banks to continuously output data from the memory banks to the common data bus.

2. The memory device of claim 1, wherein the data register is a single-stage data buffer.

3. The memory device of claim 1, wherein the data register is a multi-stage data buffer.

4. The memory device of claim 1, wherein the memory device operates in a synchronous mode, and the programmable latency time is a duration of a predetermined number of clock cycles of the access signal.

5. The memory device of claim 1, wherein the memory device operates in an asynchronous mode, and the programmable latency time is a predetermined delay time of the access signal.

6. The memory device of claim 1, further comprising:
   a drive circuit, directly coupled to the common data bus, the drive circuit arranged for driving the data received from the common data bus onto an external data bus externally connected to the memory device.

7. The memory device of claim 1, further comprising:
   at least one buffer stage, coupled to the common data bus, the at least one buffer stage arranged for buffering the data received from the common data bus and outputting the buffered data; and
   a drive circuit, coupled to the at least one buffer stage, the drive circuit arranged for driving the buffered data outputted from the at least one buffer stage onto an external data bus externally connected to the memory device.

8. The memory device of claim 1, wherein the access signal indicates a plurality of address read commands, each of storage devices of the memory banks comprises a memory cell array, and a number of the memory banks is greater than a row cycle time of one of the memory banks divided by a minimum time interval between two consecutive address read commands of the address read commands.

9. The memory device of claim 1, wherein the access signal indicates a plurality of address read commands, and a number of the memory banks is greater than the programmable latency time divided by a minimum time interval between two consecutive address read commands of the address read commands.

* * * * *